US010795405B2

(12) United States Patent
Pasqualetto

(10) Patent No.: US 10,795,405 B2
(45) Date of Patent: Oct. 6, 2020

(54) METHODS AND DEVICES FOR COUNTING A SERVICE DURATION FOR A SPREAD CLOCK SIGNAL AND DETERMINING OR GENERATING AN ACTUAL TIME DURATION

(71) Applicants: Continental Automotive France, Toulouse (FR); Continental Automotive GmbH, Hannover (DE)

(72) Inventor: Angelo Pasqualetto, Toulouse (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 131 days.

(21) Appl. No.: 16/069,644

(22) PCT Filed: Dec. 21, 2016

(86) PCT No.: PCT/EP2016/002151
§ 371 (c)(1),
(2) Date: Jul. 12, 2018

(87) PCT Pub. No.: WO2017/121446
PCT Pub. Date: Jul. 20, 2017

(65) Prior Publication Data
US 2019/0079555 A1    Mar. 14, 2019

(30) Foreign Application Priority Data
Jan. 15, 2016   (FR) .................................... 16 50322

(51) Int. Cl.
*G06F 1/14*   (2006.01)
*G06F 1/08*   (2006.01)
(Continued)

(52) U.S. Cl.
CPC .................. *G06F 1/14* (2013.01); *G06F 1/08* (2013.01); *H04B 15/04* (2013.01); *H03L 7/0805* (2013.01)

(58) Field of Classification Search
CPC ..... G06F 1/10; G06F 1/04; G06F 1/08; G06F 1/14; G06F 1/18; H04B 15/04; H03L 7/0805
(Continued)

(56) References Cited

U.S. PATENT DOCUMENTS 6,731,667 B1    5/2004  Lee et al.
8,634,446 B2 *  1/2014  Kusunoki ............... H04B 15/02
                                                 375/130

(Continued)

FOREIGN PATENT DOCUMENTS

JP    2002209109 A    7/2002

OTHER PUBLICATIONS

English translation of the Written Opinion for International Application No. PCT/EP2016/002151, dated Mar. 20, 2017, 12 pages.
(Continued)

*Primary Examiner* — Brian T Misiura
(74) *Attorney, Agent, or Firm* — RatnerPrestia

(57) ABSTRACT

A method for counting a service duration of time measurement on a clock signal including periodic transitions and for determining an actual duration (tmr) of measurement as a function of the service duration, the signal having undergone spectrum spreading according to a periodic variation algorithm causing a frequency modulation of the clock transitions of the signal and creating a difference between actual duration (tmr) and service duration. There are counted during successive time increments at least service times for starting (t_d_s) and stopping (t_a_s) and, on the basis of these times, there are determined actual times for starting
(Continued)

and for stopping (t_d, t_a) serving for the calculation of the actual duration of measurement (tmr) as a function of the parameters of the variation algorithm. The invention also relates to a method of continuous compensation of the error between actual and service durations.

6 Claims, 9 Drawing Sheets

(51) Int. Cl.
*H04B 15/04* (2006.01)
*H03L 7/08* (2006.01)

(58) Field of Classification Search
USPC .................................................. 713/400, 500
See application file for complete search history.

(56) References Cited

U.S. PATENT DOCUMENTS

| | | | |
|---|---|---|---|
| 8,879,680 B2* | 11/2014 | Tresidder | G06F 13/4273 |
| | | | 375/295 |
| 9,207,693 B1* | 12/2015 | Tan | H03K 3/84 |
| 2008/0106748 A1 | 5/2008 | Tsukahara et al. | |
| 2010/0083024 A1 | 4/2010 | Shibata | |

OTHER PUBLICATIONS

International Search Report and Written Opinion for International Application No. PCT/EP2016/002151, dated Mar. 20, 2017—16 pages.

* cited by examiner

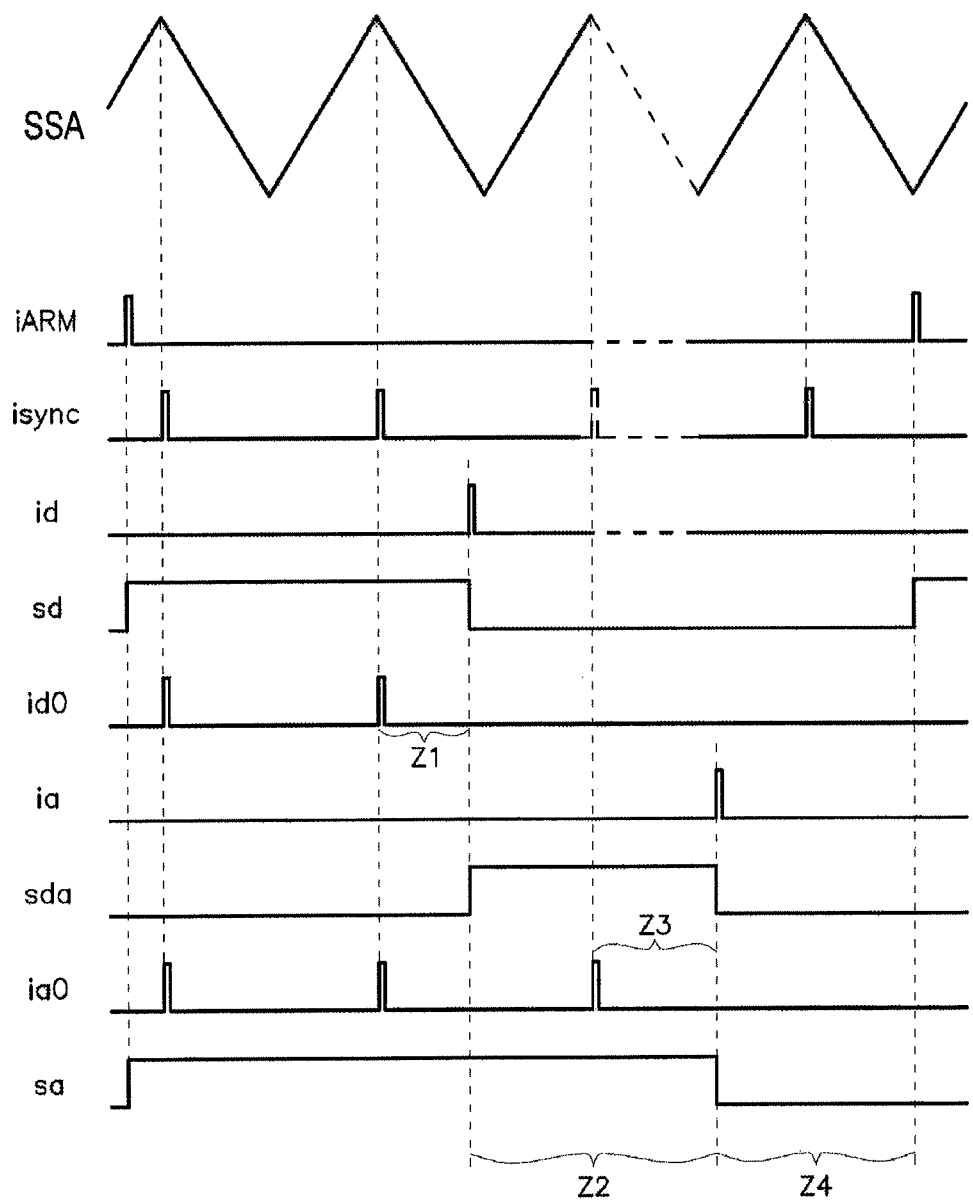

METHODS AND DEVICES FOR COUNTING A SERVICE DURATION FOR A SPREAD CLOCK SIGNAL AND DETERMINING OR GENERATING AN ACTUAL TIME DURATION

CROSS REFERENCE TO RELATED APPLICATIONS

This application is the U.S. National Phase Application of PCT International Application No. PCT/EP2016/002151, filed Dec. 21, 2016, which claims priority to French Patent Application No. 1650322, filed Jan. 15, 2016, the contents of such applications being incorporated by reference herein.

FIELD OF THE INVENTION

The subject of the present invention is a method for counting a service duration of time measurement on a clock signal comprising periodic clock transitions as well as for determining an actual duration of time measurement as a function of the service duration, the clock signal having undergone spectrum spreading.

The subject of the present invention is also a method for compensating the shift between service durations and actual durations of time measurement in the clock signal.

Likewise, the subject of the present invention is respective counting and compensation circuits for the implementation of these methods.

The present invention applies to a clock signal having undergone frequency spectrum spreading so as to decrease the amplitude of the clock frequency spectral line according to a periodic variation algorithm causing a frequency modulation of the clock transitions of the signal and creating a difference between actual duration and service duration.

BACKGROUND OF THE INVENTION

In electronics, a clock signal is an oscillating and periodic electrical signal which paces the actions of an electronic circuit and especially the synchronization of the various elements present in the circuit.

The clock signal periodically exhibits a clock transition occurring at a precise frequency termed the clock frequency. This clock frequency of an electronic circuit, for example an application specific integrated circuit better known by the abbreviation ASIC or a microprocessor, is visible during electromagnetic interference measurements, these measurements evaluating the disturbance that the electronic circuit causes on other electronic apparatus situated in its environment.

In the spectral domain, a clock is visible in the form of an abrupt elevation of amplitude at the clock frequency. The resulting graphs exhibit a vertical stroke and it is common to speak of frequency spectral line in this regard.

To limit the amplitude of a clock frequency spectral line, it is known to subject the clock signal to spectrum spreading. A modulation of the transition of the clock signal is then applied intentionally in order to reduce the level of the spectral line at the clock frequency. This can be done by using a periodic variation algorithm creating a spread spectrum. It is possible to use various spreading algorithms with different parameters relating essentially to a degree of spreading, a mode of smearing and/or of modulation.

By applying a variation algorithm for spectrum spreading to a clock signal, the precision of the clock signal is affected by a modulation on the clock frequency. The periodicity of the clock signal is also affected. It is possible to continue to speak of periodicity over a service time related to the deformed-clock pulses but this is no longer true at this level over an actual time. Over the actual time, the periodicity reduces to that of the variation algorithm.

In FIG. 1 can be seen a percentage precision, indicated as ordinate, as a function of time, indicated as abscissa, of the clock signal having undergone spectrum spreading by a linear variation algorithm of plus or minus 5% of the clock frequency and a period of 100 µs of the linear variation algorithm.

For spectrum spreading, the most commonly used variation algorithm is a linear, periodic and symmetric algorithm because it gives a uniform distribution of the clock frequency in a chosen interval of frequencies.

SUMMARY OF THE INVENTION

It is however possible to use within the framework of an aspect of the present invention another spectrum spreading algorithm on condition that the latter is periodic. Symmetry and linearity of the variation algorithm for the spectrum spreading are not necessary conditions.

In FIG. 2 is illustrated a nonlimiting example of a linear, periodic and symmetric spectrum spreading algorithm. As other examples of algorithm may be cited, without this being limiting, a sinusoidal algorithm or a linear algorithm with stepped variations in the form of a staircase.

FIG. 2 is in two parts, with a first part on the left illustrating a linear variation algorithm which is periodic and symmetric in triangles SSA, SSA being the acronym for spectral spreading algorithm, as a function of time. The SSA algorithm exhibits at frequency F a positive frequency shift maximum Fhmax and a negative frequency shift maximum Fhmin following one another periodically with a period t_p for a time t.

The spectrum spreading caused by the implementation of this SSA variation algorithm is shown in the part on the right of FIG. 2. The clock frequency spectral line without spectrum spreading, referenced Fh, has been transformed into a zone of frequencies of slightly higher level than the spectral background noise. This zone is bracketed by a minimum frequency Fhmin and a maximum frequency Fhmax after spectrum spreading.

The problem of the shift of the transitions in a clock signal after frequency spectrum spreading has been recognized by the prior art but no satisfactory solution has hitherto been found.

For example, document U.S. Pat. No. 6,731,667, incorporated herein by reference, describes a circuit for recovering a clock signal so as to reduce the electromagnetic emissions by spectrum spreading. A spectrum spreading generator receives an input clock signal and generates a frequency-modulated clock signal. A zero delay buffer processes the modulated clock signal and generates an output clock signal. The frequency-modulated clock signal and the output clock signal are aligned in phase so that there is no phase difference between the output clock signal and the frequency-modulated clock signal.

The clock recovery circuit furthermore comprises a delay lock loop circuit which reduces the frequency shift. Such a method is difficult to implement, the zero delay buffer involving a certain processing lag which is prejudicial to the precision of the output clock signal.

The problem underlying an aspect of the present invention is to perform, on the one hand, a measurement of shift of the clock signal and, on the other hand, a compensation of this shift.

For this purpose, an aspect of the present invention relates to a method for counting a service duration of time measurement on a clock signal comprising periodic clock transitions in an electronic circuit and for determining an actual duration of time measurement as a function of the service duration, the clock signal having undergone spectrum spreading according to a periodic variation algorithm causing a frequency modulation of the clock transitions of said signal and creating a difference between actual duration and service duration, noteworthy in that there is undertaken the counting during successive time increments of at least one service time for starting, of a service time for stopping and, on the basis of these service times for starting and for stopping, there is undertaken the determination of actual times for starting and for stopping serving for the calculation of the actual duration of measurement as a function of the parameters of the variation algorithm.

An aspect of the present invention is based on the fact that, as a specific spectrum spreading algorithm exhibiting known variation parameters causing the clock frequency to vary in a limited frequency band is applied to the clock signal, it is possible to use these variation parameters to establish a relation between actual duration of measurement and service duration so as to keep the time counters as precise as they were before spectrum spreading.

It should be noted that the service duration can also be counted at the same time as the service times for starting and for stopping.

Advantageously, the difference between the actual duration of measurement tmr and the service duration tms is established as a function of the actual times t_d, t_a for starting and for stopping and of the service times t_d_s, t_a_s for starting and for stopping according to the following formula:

$$Tmr-tms=(t\_a-t\_a\_s)-(t\_d-t\_d\_s)$$

The variation algorithm being periodically oscillating between maximum and minimum frequencies, the parameters of the algorithm are at least the period of the algorithm and a point of application of the algorithm referring to the maximum or minimum frequencies or to a median point between maximum and minimum frequencies.

In the difference between duration of service and actual duration any multiple of the period of the algorithm is expressed by the same value of service time and of actual time and does not contribute to this difference.

Advantageously, there is undertaken the counting of the service times for starting and for stopping as well as of the service duration, an arming pulse being emitted to mark the initialization of the method, a synchronization pulse being emitted periodically in correspondence with the variation algorithm, with, for each respective counting of the service times and duration, an emission of a start pulse initiating the beginning of the counting of the service time for stopping and of the service duration for the measurement and initiating the end of the counting of the service time for starting, the service time for starting being counted between the last synchronization pulse preceding the start pulse and this start pulse, the service duration being counted between the start pulse and the pulse for stopping, the pulse for stopping also terminating the counting of the service time for stopping beginning with the last synchronization pulse preceding the stopping pulse.

Advantageously, for a given clock modulation, there is compiled a table giving the actual duration as a function of the service duration and a chart giving the differences rounded to a multiple of a clock period as a function of a rank in a succession of pulses.

An aspect of invention also relates to a method for compensating the shift between service durations and actual durations of time measurement, which comprises a method for determining a service duration on a clock signal in an electronic circuit such as described previously, in which the compensation is done as a function of the preceding actual and service durations according to preceding clock pulses with:

on the basis of the chart giving the differences rounded to an integer number of clock periods as a function of a rank in a succession of pulses, determination of the pulse ranks from which a shift, respectively positive or negative, of a clock period is observed with respect to the absence of modulation, with formation of a first group of numbers of pulse rank associated with an increase in the counting of the clock pulses and of a second group of numbers of pulse rank associated with a decrease in the counting of the clock pulses, allocating of a rank for a pulse at a given instant in a succession of pulses of a clock signal, comparison of this allocated rank with the rank numbers of the first and second groups and determination of whether the allocated rank belongs to the first or to the second group or to neither of the two groups, for each pulse, updating of a dynamic bias equal to the error between actual duration and service duration, this dynamic bias decreasing, increasing or remaining stable as a function of the membership in the first, in the second or in neither of the groups, in parallel with these steps, counting of the service duration with determination of a corresponding actual duration and of a second error between actual duration and service duration thus counted, comparison of the first and second errors, emission of an event indicator as soon as a comparison gives equality between first and second errors.

Advantageously, for the first and second errors, there is added a constant heel in the guise of a positive natural integer sufficient for the first and second errors to be always greater than 0.

Advantageously, for a symmetric periodic variation algorithm serving for the spectrum spreading, there are charted the differences rounded to an integer number of clock periods while limiting this charting to a half-period of the variation algorithm.

An aspect of the invention comprises a counting circuit for the implementation of such a method for determining a service duration with respect to a clock signal, which comprises three time counters associated respectively with the counting of the service time for starting the measurement, of the service time for stopping the measurement and of the service duration of measurement and means for emitting arming pulses, clock pulses, synchronization pulses, pulses for starting and pulses for stopping, with:

a first bistable trigger emitting a so-called start signal toward the first counter measuring a service time for starting, demarcating an arming of the measurement system, with setting to 1 of the start signal by a first arming pulse and setting to 0 of the signal by a start pulse, the counting of the time by the first counter being done as a function of a clock signal when the start signal is set to 1, means of transmission to the first counter of a first synchronization pulse resetting the first counter to 0, a second bistable trigger emitting a so-called start-stop duration signal toward a second counter measuring a service duration, with setting to 1 of the signal by a start pulse and setting to 0 of the signal by a pulse for stopping, the counting of the time by the second counter being done as a function of the clock signal when the signal for stopping is set to 1, a third bistable trigger emitting a so-called stopping signal toward a third counter measuring a service time for stopping with a setting to 1 of the signal by an arming pulse and a setting to 0 of the signal by a stopping pulse, the counting of the time by the third counter being done as a function of the clock signal when the stopping signal is set to 1, means of transmission to the third counter of synchronization pulses resetting the third counter to zero, respective means of transmission to the three counters of an arming pulse resetting these counters to zero.

An aspect of the invention comprises a compensation circuit for the implementation of such a method for compensating the shift between service measurement duration and actual measurement duration, which comprises:

a counter of pulses in a clock signal circuit, the pulse counter allocating a rank to each pulse of a succession of pulses, comparison modules for comparing the rank allocated to each effective pulse of the first and second groups with each of the ranks of the succession of pulses, a module being present for each effective pulse rank of the first and second groups, a direction register determining an addition or a deduction in the updating of a dynamic bias by a first cell for evaluating a first error, the first cell exhibiting, for each pulse, means of addition or of deduction of the dynamic bias to or from the first error, a second cell for evaluating a second difference between an actual duration and a service duration, the service duration being measured by a down-counter on the basis of a start pulse and the actual duration being introduced additionally into the second cell, a comparison cell performing the comparison between the first and second cells with emission of an event indicator when the first and second errors are equal.

BRIEF DESCRIPTION OF THE DRAWING

Other features, objects and advantages of aspects of the present invention will become apparent upon reading the detailed description that will follow and upon examining the appended drawings, given by way of nonlimiting examples, and in which:

FIGS. 5 and 6 show, for FIG. 5, a diagram of a counting circuit for the steps of counting a service duration in the methods according to an aspect of the present invention and, for FIG. 6, a timechart of the various pulses and of the signals pacing the counting of the service duration in the methods according to an aspect of the present invention.

DETAILED DESCRIPTION OF THE PREFERRED EMBODIMENTS

An aspect of the present invention relates, after a spectrum spreading carried out on a frequency band relating to the deletion of a clock spectral line, to the correction in terms of synchronization of the value of the counters, taking into account the type of variation algorithm applied for the spectrum spreading.

This correction can be composed, on the one hand, into a counting of a service duration of measurement and into the establishment of a correspondence, which is a consequence of the clock modulation, between the service duration of measurement and an actual duration of measurement for the determination of the actual duration and, on the other hand, into a compensation of this clock shift. The counting and the determination of the actual duration can be done without being followed by the compensation or be done with the implementation of another form of compensation. In the case of a compensation, the counting and the correspondence are done prior to the compensation, the compensation taking account of the counting and of the correspondence relation established between service durations and actual duration.

Figure 1:
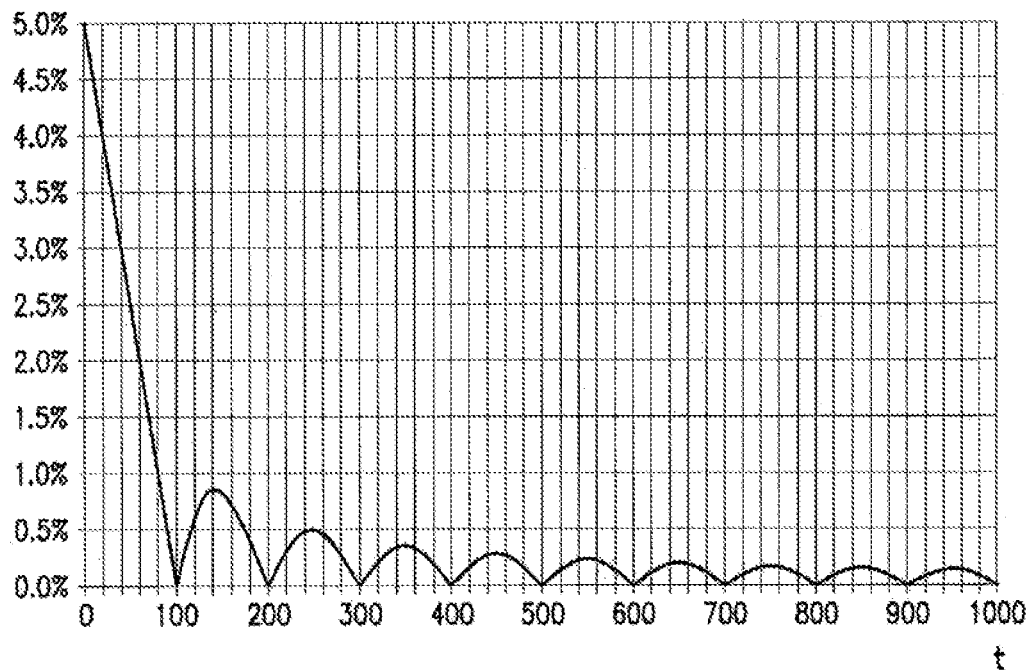
FIG. 1 is a curve showing the percentage inaccuracy during a spectrum spreading with a linear variation algorithm of 5% of the clock frequency and of a period of 100 µs, without the correction by compensation proposed by an aspect of the present invention.
Figure 2:
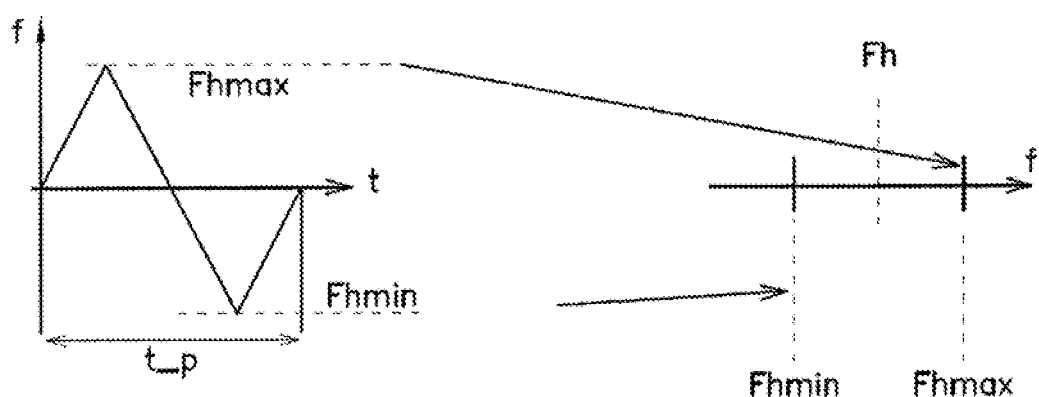
FIG. 2 is composed of two schematic representations with, on the one hand, a part of the curve of the spectrum spreading variation algorithm with a frequency variation during time, this algorithm being of the linear, periodic and symmetric variation type and, on the other hand, the spectral impact, i.e. an interval of clock frequency variation after spectrum spreading. The method for counting and determining an actual duration of time measurement as a function of the service duration as well as the method for compensating a clock transition modulation according to an aspect of the present invention can be implemented in conjunction with such a spectrum spreading algorithm.

FIGS. 1 and 2 have already been described in the introductory part of the present patent application, illustrating a spectrum spreading known from the prior art.

Figure 3:
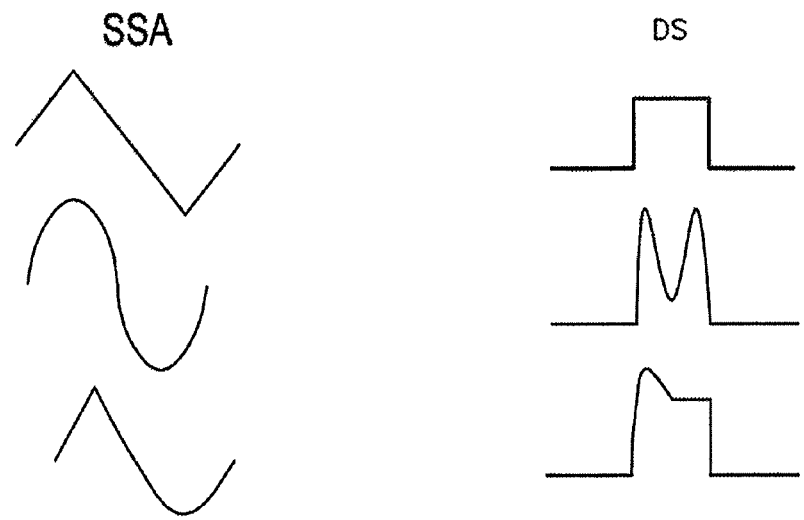
FIG. 3 shows various embodiments of a variation algorithm for spectrum spreading on the clock frequency spreading signal, the application of each of these embodiments giving a specific spectral density, the methods according to an aspect of the present invention being able to be implemented for the clock signal having undergone such spreading.

FIG. 3 shows the effect of several variation algorithms for spectrum spreading SSA on the spectrum of frequencies with their effect on a spectral density referenced DS. Therein feature a linear variation algorithm which culminates in a slot-like spectral density, a sinusoidal variation algorithm which culminates in a two-hump spectral density, a rectified sinusoid variation algorithm (negative alternations) which culminates in a spectral density evoking a rounded trapezium. As other forms of algorithms could be cited a staircase variation algorithm which would culminate in a comb-shaped spectral density, and an algorithm with steeper slopes at the extremes which would culminate in a bell-shaped spectral density. For a period and extreme values which are identical in the algorithm the spectral densities all have the same area, thus implying a very high level for the frequency comb, in comparison to the other forms of spectral density. However, the frequency comb already represents a substantial benefit with respect to a single frequency (absence of modulation), the amplitude being divided by the number of steps in the staircase form.

In FIGS. 4a, 4b, 4c and 4d which will follow, there has been chosen, as synchronization instant, the maximum of positive variation of the spectrum spreading algorithm. This synchronization is used in erasing the counters. It is however possible to choose another point of the curve of the algorithm, for example the maximum of negative variation, the nominal value or any other point of the curve of the algorithm and consequently of the clock frequency spreading signal.

FIGS. 4a to 4d give nonlimiting examples of periodic variation algorithms for spectrum spreading that may be used within the framework of an aspect of the invention. The repeated algorithms are those already mentioned in FIG. 3.

Figure 4A:
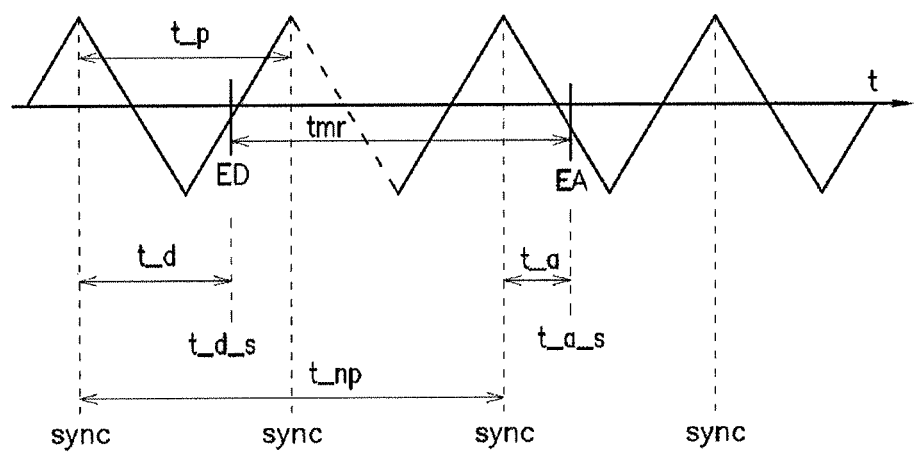
FIGS. 4a, 4b, 4c and 4d illustrate respectively the variation in frequency of four different modes of variation algorithm for a spectrum spreading with illustrations in these figures of the service duration and of the actual duration, the methods according to an aspect of the present invention being able to be implemented for such algorithms.
Figure 4B:
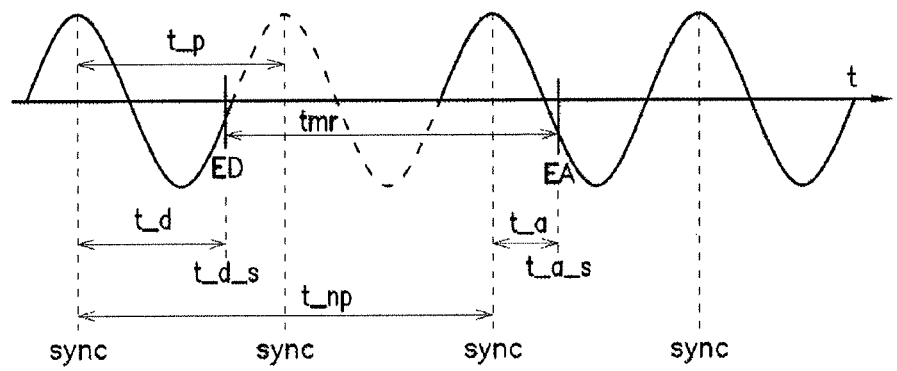
Figure 4C:
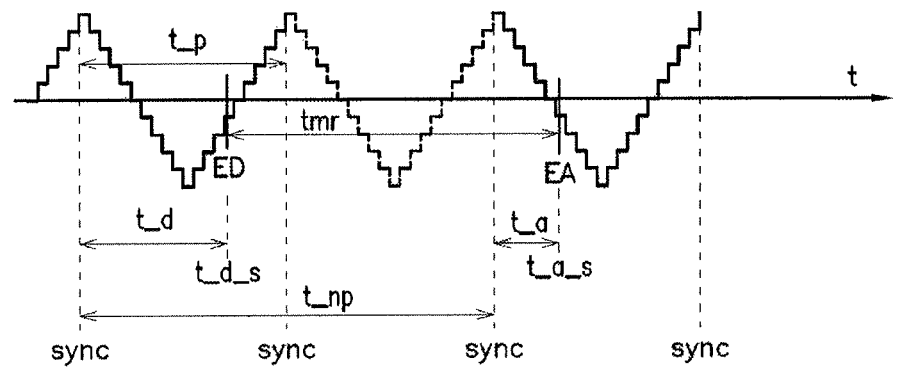
Figure 4D:
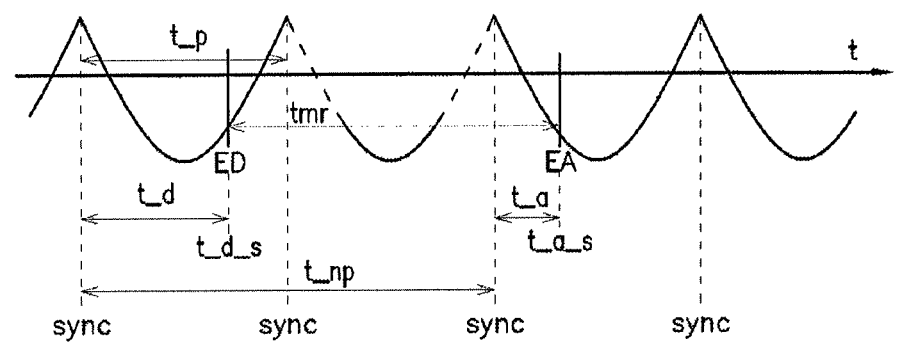

FIG. 4a repeats the linear algorithm mentioned previously, FIG. 4b shows the application of a periodic sinusoidal algorithm while FIG. 4c shows the application of a linear algorithm with a succession of staircase steps and finally FIG. 4d shows a non-symmetric variation algorithm, consisting of negative sinusoidal alternations, FIG. 4c shows a variation algorithm where the variation slopes are accelerated on the modulation minima and maxima. Other forms of variation algorithm for spectral spreading are also possible, for example a pointed bell-shaped very specific variation algorithm.

The clock frequency distribution in a frequency reference frame, called the spectral density, is specific to the algorithm.

It is also possible, for clock signals fixed by quartz and for which the spectral line is very fine with a very high amplitude, to use a spectrum spreading variant which consists in the use of a phase-locked circuit, known by the abbreviation PLL standing for "Phase Locked Loop", with the obtaining of a signal of frequency f_quartz. p/q, p and q being correction factors.

By modifying the factors p and q, it is then possible to generate frequency variations with a small interval. It is also possible to degrade the operation of the phase-locked circuit by introducing a loop lag ensuring too large a correction and then too small a correction, as is done by a linear algorithm.

On referring especially to FIGS. 4a to 4d, for all the spectrum spreading algorithms and all the modes of frequency variations in a small interval, i.e. an actual duration of measurement tmr commencing with an actual time for starting t_d and ending with an actual time for stopping t_a, the counter is active over a service duration tms, which is a duration reported by the electronic circuit, and which is different from the actual duration tmr. This is due to the modulation of the clock signal by the application of the spectrum spreading algorithm.

The service duration tms is affected by the frequency variations engendered by the spectrum spreading. The actual duration tmr is never accessible directly in view of the variation of the clock frequency as a function of time f(t) which is undergone in a spectrum spreading. The service duration tms varies in a discrete manner, that is to say by steps, since its value increases only at each significant transition of the clock signal.

For the measurements of the counter, the service duration tms begins at a service time for starting t_d_s and finishes at a service time for stopping t_a_s. The service time for starting t_d_s is different from the actual time for starting t_d. The service duration tms is different from the actual duration of measurement tmr. The service time for stopping t_a_s is different from the actual time for stopping t_a. A start event ED corresponds to the service time for starting t_d_s and an end event EA corresponds to the service time for stopping t_a_s.

An aspect of the present invention makes provision according to one of its aspects for retrieving, on the one hand, an actual time for starting t_d on the basis of a service time for starting t_d_s and, on the other hand, an actual time for stopping t_a on the basis of a service time for stopping t_a_s, thus making it possible thereafter to retrieve the actual duration of measurement tmr.

Table 1 gives an example of this conversion of service time for starting or for stopping respectively t_d_s and t_a_s for the restitution of an actual time t_d for starting or t_a for stopping, this being for the spectrum spreading algorithm of the type of that mentioned previously and shown in FIG. 4a. The variation algorithm exhibits a period of 40 μs and a frequency variation between 4.5 MHz and 5.5 MHz.

It should be borne in mind that table 1 represents just an example dependent on parameters of a variation algorithm with a specific period, modulation amplitude for the spectrum spreading, type of symmetric or asymmetric variation and nominal clock frequency. All these parameters can change and serve for the compilation of a table other than table 1. On the other hand, the principle of determining an actual duration tmr as a function of a service duration tms remains the same.

In table 1, the "integer" parts of these service times for starting or for stopping, respectively t_d_s and t_a_s in FIG. 4a, are indicated in the first column of the table as being counted from 0 to 39 μs while the "decimal" parts are indicated in the first row of this table as being counted in 0.2 μs increments from 0 up to 0.8 μs.

TABLE 1

|    | 0      | 0.2    | 0.4    | 0.6    | 0.8    |
|----|--------|--------|--------|--------|--------|
| 0  | 0.000  | 0.181  | 0.364  | 0.546  | 0.729  |
| 1  | 0.912  | 1.096  | 1.280  | 1.464  | 1.648  |
| 2  | 1.833  | 2.018  | 2.203  | 2.389  | 2.575  |
| 3  | 2.761  | 2.948  | 3.135  | 3.322  | 3.510  |
| 4  | 3.698  | 3.886  | 4.075  | 4.264  | 4.453  |
| 5  | 4.643  | 4.833  | 5.023  | 5.214  | 5.405  |
| 6  | 5.596  | 5.788  | 5.980  | 6.173  | 6.366  |
| 7  | 6.559  | 6.752  | 6.946  | 7.140  | 7.335  |
| 8  | 7.530  | 7.725  | 7.921  | 8.117  | 8.314  |
| 9  | 8.511  | 8.708  | 8.905  | 9.104  | 9.302  |
| 10 | 9.501  | 9.700  | 9.900  | 10.100 | 10.300 |
| 11 | 10.501 | 10.702 | 10.904 | 11.106 | 11.308 |
| 12 | 11.511 | 11.714 | 11.918 | 12.122 | 12.327 |
| 13 | 12.532 | 12.737 | 12.943 | 13.149 | 13.356 |
| 14 | 13.563 | 13.771 | 13.979 | 14.187 | 14.396 |
| 15 | 14.606 | 14.815 | 15.026 | 15.237 | 15.448 |
| 16 | 15.660 | 15.872 | 16.085 | 16.298 | 16.512 |
| 17 | 16.726 | 16.940 | 17.156 | 17.371 | 17.587 |
| 18 | 17.804 | 18.021 | 18.239 | 18.457 | 18.676 |
| 19 | 18.895 | 19.115 | 19.335 | 19.556 | 19.778 |
| 20 | 19.999 | 20.221 | 20.443 | 20.664 | 20.884 |
| 21 | 21.104 | 21.323 | 21.542 | 21.760 | 21.978 |
| 22 | 22.195 | 22.412 | 22.628 | 22.843 | 23.059 |
| 23 | 23.273 | 23.487 | 23.701 | 23.914 | 24.127 |

TABLE 1-continued

|    | 0      | 0.2    | 0.4    | 0.6    | 0.8    |
|----|--------|--------|--------|--------|--------|
| 24 | 24.339 | 24.551 | 24.762 | 24.973 | 25.184 |
| 25 | 25.393 | 25.603 | 25.812 | 26.020 | 26.228 |
| 26 | 26.436 | 26.643 | 26.850 | 27.056 | 27.262 |
| 27 | 27.467 | 27.672 | 27.877 | 28.081 | 28.285 |
| 28 | 28.488 | 28.691 | 28.893 | 29.095 | 29.297 |
| 29 | 29.498 | 29.699 | 29.899 | 30.099 | 30.299 |
| 30 | 30.498 | 30.697 | 30.895 | 31.094 | 31.291 |
| 31 | 31.488 | 31.685 | 31.882 | 32.078 | 32.274 |
| 32 | 32.469 | 32.664 | 32.859 | 33.053 | 33.247 |
| 33 | 33.440 | 33.633 | 33.826 | 34.019 | 34.211 |
| 34 | 34.403 | 34.594 | 34.785 | 34.976 | 35.166 |
| 35 | 35.356 | 35.546 | 35.735 | 35.924 | 36.113 |
| 36 | 36.301 | 36.489 | 36.677 | 36.864 | 37.051 |
| 37 | 37.238 | 37.424 | 37.610 | 37.796 | 37.981 |
| 38 | 38.166 | 38.351 | 38.535 | 38.719 | 38.903 |
| 39 | 39.087 | 39.270 | 39.453 | 39.635 | 39.818 |

For example, if the service time for starting t_d_s is 30.2 μs, it is necessary to take, to retrieve the actual time for starting t_d, the numeral situated at the intersection of the row beginning from the numeral 30 of the first column and of the column beginning from the numeral 0.2 in the first row, thus giving as actual time for starting t_d=30.697 μs.

One proceeds similarly to retrieve the actual time for stopping t_a in the case where the service time for stopping t_a_s is equal to 10.2 μs, this then giving t_a=9.7 μs, these two values of actual time for starting t_d=30.697 μs and of actual time for stopping t_a=9.7 μs being circumscribed in table 1.

It is possible to devise other tables each exhibiting another form of results presentation, for example an inverted table giving the service time as a function of the actual time.

As a start event and an event for stopping may be separated by several synchronizations with resetting to the initial state of the counters which erase the service times for starting and for stopping respectively t_d_s and t_a_s, the difference between these service times for starting and for stopping is not always equal to the service duration tms.

According to an aspect of the present invention, in a method for counting a service duration tms of time measurement on a clock signal comprising periodic clock transitions in an electronic circuit and for determining the difference between an actual duration tmr of time measurement and the service duration tms, there is undertaken the counting during successive time increments at least of a service time for stopping t_a_s and of the service duration tms, if relevant also of a service time for starting t_d_s. On the basis of these service times for starting and for stopping t_d_s, t_a_s, there is undertaken the determination of actual times for starting and for stopping t_d, t_a serving for the calculation of the actual duration of measurement. This determination or correspondence matching is done as a function of the parameters of the variation algorithm.

An example will be given of determining an actual time by correspondence with a service time for a specific spectrum spreading variation algorithm. Similar calculations can be conducted for all the types of periodic variation algorithm for spectrum spreading.

Firstly recourse is had to a modulated time te, according to the spectrum spreading algorithm SSA, varying continuously but undergoing the variations of clock frequency with a very low granularity as if an infinitely small time interval dt were the period of the clock frequency:

$$te(t)=te(t-dt)+(fr/f(t))\times dt$$

where te is a function of t, fr is the value of the reference frequency close to the nominal frequency fn, f(t) is the frequency as a function of t and t is the time.

This makes it possible to calculate the value of each sample te(t) as a function of the value tm(t−dt) of the preceding sample.

The law of frequency variation f(t) of the variation algorithm for spectrum spreading is used therein. As mentioned previously, several possible ones exist. The one which will be taken is the segment-wise linear periodic variation SSA illustrated in FIGS. 2 and 4a and leading to a slot-like spectral density.

On referring to all the figures and more particularly to FIG. 2, for a variation rate v, the maximum frequency Fhmax is obtained at a frequency of fn·(1+v) and the minimum frequency Fhmin is obtained at a frequency of fn·(1−v). By considering the time origin when the frequency passes over a maximum, let t1 be the time of reaching a minimum frequency Fhmin and t2=t_p the time of reaching a maximum frequency Fhmax, we have:

$$f(0)=f(t2)=fn\cdot(1+v)$$

with a maximum frequency at t=0 and at t=t2, $$f(t1)=fn\cdot(1-v)$$

with a minimum frequency at t=t1

$$f(t)=A1\times t+B1 \text{ between 0 and } t1$$

$$f(t)=A2\times t+B2 \text{ between } t1 \text{ and } t2$$

These relations allow the calculation of the coefficients A1, A2, B1 and B2.

$$B1=fn\cdot(1+v)$$

$$A1=(1/t1)\times(fn\cdot(1-v)-fn\cdot(1+v))=-2\times v\times fn/t1$$

$$A2=2\times v\times fn/(t2-t1)$$

$$B2=fn\cdot(1+v\times(1-2\times t2/(t2-t1)))$$

In the case of this variation algorithm for spectrum spreading, the construction of the cumulative algorithm for a spreadsheet follows the following method.

There is undertaken the calculation of the frequency fj for the element j on the basis of the temporal element tj:

$$fj=f(tj)=A\times tj+B$$

and then the calculation of the temporal increment on te:

$$(tej-ei)=(tj-ti)\times fr/fj, \text{ where } j=i+1$$

Finally, there is obtained a list of temporal elements te relating to corresponding temporal elements t.

Only the elements ts equal to te which are multiples of the nominal period Tn=1/fn are retained.

These elements ts are the temporal service elements, the only ones accessible and used to estimate the time in the absence of correction.

The aforementioned method culminates in the formula:

$$tej=tei+(tj-ti)\times fr/fj$$

The granularity dt=tj−ti, which is the same independently of j, ought to be chosen as small as possible. The drawback is that the number of elements is thereby increased. There is a risk that the aggregate of the rounding errors leads to a sizable error.

This is why it is not advantageous to use a cumulative formula where each element is calculated as a function of the preceding element.

Thus, in order to express each element without involving its predecessor:

$$tep = te1 + fr \times \Sigma_{j=2}(dt)/fj$$

By rendering the element dt=tj−ti infinitely small, it is the following integration which has to be solved:

$$te(t) = fr \times \int dt/f(t)$$

Using f(t)=A×t+B, this becomes:

$$te(t) = fr \times \int dt/(A \times t + B) = (fr/A) \times \text{Ln}(A \times t + B) + C$$

C being a constant and Ln being the Naperian logarithm function.

For example, if one is concerned with the temporal interval (0; t1):

$$te(t) = fr \times \int_0^t dt/(A1 \times t + B1) = (fr/A1) \times \text{Ln}\,[(A1/B1) \times t + 1]$$

It is necessary to obtain te(t1)=t1. This would not be the case if the frequency fr were taken equal to the nominal frequency fn.

This is due to the fact that two frequencies which would be symmetric with respect to the nominal frequency whose average is fn do not culminate in symmetric periods with respect to the nominal period, and the average of these two periods is different from 1/fn. This dissymmetry at the temporal level must be compensated, thus introducing the reference frequency fr instead of the nominal frequency fn in the formulae:

$$te(t1) = t1 = (fr/A1) \times \text{Ln}\,[(A1/B1) \times t + 1]$$

As it was previously calculated that:

$$B1 = fn \cdot (1+v)$$

$$A1 = -2 \times v \times fn/t1$$

We obtain:

$$t1 = -t1 \times fr \times \text{Ln}\,[(1-v)/(1+v)]/(2 \times v \times fn)$$

$$2 \times v \times fn = fr \times \text{Ln}\,[(1+v)/(1-v)]$$

and hence $$fr = 2 \times v \times fn/\text{Ln}\,[(1+v)/(1-v)]$$

We note that this relation illustrates the non-equality of fr and of fn. It is undefined for v=0, but by letting v tend to 0, Ln [(1+v)/(1−v)] tends to 2× v, and consequently fr tends to fn.

The switch to the service times or reported times ts is a discretization of the values te(t). Only the times for which the clock exhibits a significant edge are retained.

The clock is in the frame of reference of the modulated time te and not t. Use is made of the conservation of the ratios:

$$dte/Te = dt/T$$

where T would be the clock period without spectrum spreading and Te the instantaneous period (Te(t)=1/f(t)), this period Te being accessible only by inverting the instantaneous frequency.

This means that if we have chosen a nominal frequency of 5 MHz and a temporal granulation dt of 10 ηs, then the ratio dt/T=10 ηs/200 ηs is therefore equal to 1/20. Each modulated clock pulse corresponds to a time which is a multiple of a twentieth of the clock period in the frame of reference of the modulated time te, but Te varies from one clock pulse to the next.

Whenever a significant edge appears, ts is expressed in the service frame of reference by a multiple of the nominal period, i.e. by n×0.2 μs but the actual value of the time is the antecedent t in the transformation te(t). The elements ts(t) are elements of the set of elements te(t); for these elements ts(t)=te(t).

The variable fr could also have been obtained by spreadsheet calculation by:

$$tsp = ts1 + fr \times \Sigma_{j=2}^{P}(dt)/fj$$

tsp being the element of rank p corresponding to t=p×dt and by adjusting fr in such a way that the element corresponding to t takes the same value T.

The use of the formula fr=2×v×fn/Ln [(1+v)/(1−v)] therefore avoids this experimental adjustment during a spreadsheet calculation.

In FIGS. 4a to 4d, t_np is the duration for several periods occurring between synchronizations during the actual duration tmr. This duration t_np begins at a synchronization before the start event ED and stops at the synchronization before the event for stopping EA. This duration is invariant in the actual and service temporal frames of reference while there is a compensation of the shifts over each period, so that:

$$tmr = t\_a - t\_d + t\_p$$

$$tms = t\_a\_s - t\_d\_s + t\_p$$

As the measurement counter reports the value of the service duration tms and not the actual duration tmr, the difference between these two durations can be deduced by calculation:

$$tmr - tms = (t\_a - t\_a\_s) - (t\_d - t\_d\_s)$$

Returning to the previous example of a service time for starting t_d_s of 30.2 μs and of a service time for stopping t_a_s of 10.2 μs, the difference between actual and service durations tmr−tms is −0.5 μs−0.497 μs=−0.997 μs.

The simulation is carried out for a duration to be measured varying between 1 and 20 μs per interval of 50 ηs. The clock period is calculated as a function of the frequency in force by using the variation algorithm beginning at the value of 5.5 MHz at the synchronization time. The period of the variation algorithm t_p is assumed to be constant.

The service times for starting and for stopping respectively t_d_s and t_a_s are calculated as a function of a clock signal, which will be referenced ih_s in the figures.

On the basis thereof, there is undertaken the determination of the actual duration tmr on the basis of the service duration tms as a function of the variation algorithm used. As the initial duration is known precisely, it is possible to compare the precision of measurement of the time.

The error in the service measurement duration tms is an absolute value equal to |(tms−tmr)/tmr|, tmr being as mentioned previously the actual measurement duration. The same is undertaken whatever variation algorithm is employed for the spectrum spreading.

Figure 5:
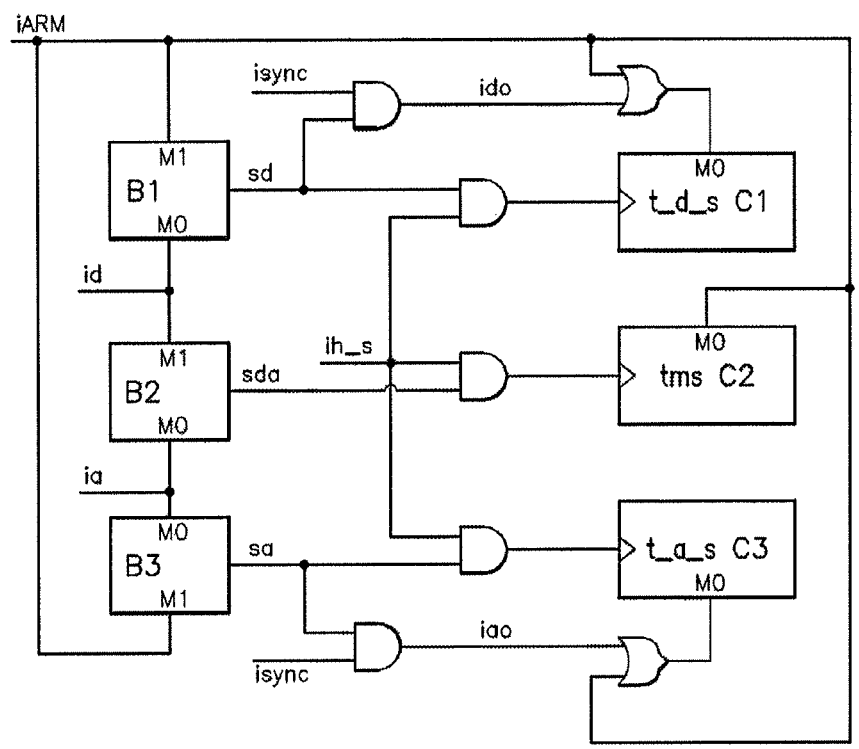

FIG. 5 shows a counting circuit for performing the service and time duration measurements intended for processing using table 1. This counting circuit performs the reckoning by three different counters C1, C2 and C3 of the measured service times of starting t_d_s and for stopping t_a_s as well as the service duration tms.

This FIG. 5 has to be taken in combination with FIG. 6 to properly understand the instants of respective triggering of the diverse signals and pulses spread over time during consecutive periods of the variation algorithm and of the counting of the service times and durations.

An arming pulse iARM fixes the initial conditions before commencing the reckoning of the pulses. This arming occurs before the start event and the start event occurs before the event for stopping.

Three counters are present in the electronic counting circuit, a counter C1 of the service time for starting t_d_s, a counter C2 of the service duration tms and a counter C3 of the service time for stopping t_a_s. The counters C1, C2 and C3 are reset to 0 by the arming pulse iARM. The arming pulse iARM is assumed to arrive with a sufficient margin with respect to the beginning of the measurement, that is to say before the synchronization pulse which precedes the start instant demarcated by the pulse id.

The synchronization and the start and stop events are demarcated by a specific pulse, namely respectively a synchronization pulse isync, a start pulse id for the starting of the counter C2 and the stopping of the counter C1 and a pulse is for the stoppings of the counters C2 and C3. The clock is based on a modulated frequency therefore in the frame of reference of the service time and emits clock pulses ih_s.

In FIG. 5, a first bistable trigger B1 for the circuit for measuring the service time for starting t_d_s emits a start signal sd with the value 1 as soon as the arming pulse iARM is received at the input M1 of the bistable trigger B1, this pulse placing it in the setting for emission of the start signal sd with the value 1.

This lasts as long as a start pulse id is not emitted to the first bistable trigger B1, this start pulse id entering the first bistable trigger B1 through the input M0 and placing the first bistable trigger B1 in the setting for emission of the start signal sd with the value 0. This can also be seen in FIG. 6.

As long as the start signal sd is operating at its value 1, the pulses of the clock ih_s can be reckoned in the counter C1 associated with this start signal sd.

Still with regard to FIGS. 5 and 6, the counter C1 is reset to zero at each synchronization pulse isync corresponding to a reset-to-0 pulse id0 of the counter C1 as long as the start signal sd remains at its value 1. When the start signal sd is at its value 0, there is no longer any resetting to zero of the counter C1 and the value of service time for starting t_d_s can then be delivered by the counter C1.

Beforehand, there has been performed a counting between the last reset-to-0 pulse id0, specific to the start signal sd and corresponding to a synchronization pulse, and the end of the operation of the start signal sd at its value 1. The zone of measurement by the counter C1 of the service time for starting t_d_s is referenced Z1 in FIG. 6. The zones for making available the service time for starting t_d_s are referenced Z2 and Z4, these two zones being directly successive without interruption.

Still referring to FIGS. 5 and 6, a second bistable trigger B2 for the circuit for measuring the service duration for stopping tms emits a start-stop duration signal sda with the value 1 as soon as a start pulse id is received by the input M1. This lasts as long as a pulse for stopping ia is not emitted to the input M0 of the second bistable trigger B2, setting the start-stop duration signal sda to the value 0.

The counter C2 relates to the service duration tms. From when and as long as the start-stop signal sda is at its value 1, the clock pulses ih_s are transmitted to the counter C2 for the counting of the pulses for the service duration tms.

The zone of measurement by the counter C2 of the service duration tms is referenced Z2 in FIG. 6. The measurement is made available in the zone Z4.

A third bistable trigger B3 for the circuit for measuring the service time for stopping t_a_s emits a stopping signal sa with the value 1 as soon as an arming pulse iARM is received by its input M1. This lasts as long as a stopping pulse ia is not emitted to the third bistable trigger B3 by its input M0, so setting the stopping signal to the value 0.

As long as the stopping signal sa is operating at its value 1, the pulses of the clock i_h_s are reckoned in the counter C3 associated with this stopping signal. This counter C3 is reset to 0 at a synchronization pulse corresponding to a reset-to-0 pulse ia0 of the counter C3 as long as the stopping signal sa remains at its value 1.

When the stopping signal sa is at its value 0, there is no longer any resetting to zero of the counter C3. Beforehand there has been performed a counting by the counter C3 of the pulses between the last reset-to-0 pulse ia0 corresponding to a synchronization pulse specific to the stopping signal sa and the end of the operation of the stopping signal sa at its value 1 corresponding to the stopping pulse ia. This defines the zone Z3 which corresponds to the zone of countdown of the service time for stopping t_a_s by the counter C3.

The zone for making available the service time for stopping t_a_s and of the service duration tms is referenced Z4, and is therefore a common zone for making available the service times for starting and for stopping t_d_s, t_a_s and the service duration tms.

FIGS. 7a, 7b, 8a, 8b illustrate compensation circuits for the generation of an actual time. In these figures and in the description referring to these figures, tgr will be used for actual generation time and tgs for service generation time, differentiating them from the preceding actual and service measurement times. For the generation of an event the problem differs from the measurement of the time, given that its aim is, after a start event, to provide for an action after a generated duration or tg. The difficulty is that the actual time tgr can only be deduced, in the method described previously, by a calculation which itself consumes time on the basis of the service duration tgs.

It is therefore appropriate to proceed by anticipation so as not to add any calculation time to the clock time. This corresponds to the formula:

$$tgs-tgr=(t\_a\_s-t\_a)-(t\_d\_s-t\_d)$$

As taking such a calculation time could induce an additional calculation lag, it is necessary to employ a method of continuous compensation.

Table 2, derived from table 1, shows the difference (actual time−service time) rounded as clock pulses as a function of the service time for starting t_d_s or stopping t_a_s deduced from table 1. For example if the service time t_d_s=1.2 µs, table 1 gives an actual time t_d=1.096 µs. The difference is 1.096−1.2=−0.104 µs which is rounded to a counting of periods −1, that is to say −0.2 µs.

TABLE 2

| | circumscribed | | | | |
|---|---|---|---|---|---|
| | 0 | 0.2 | 0.4 | 0.6 | 0.8 |
| 0 | 0 | 0 | 0 | 0 | 0 |
| 1 | 0 | −1* | −1 | −1 | −1 |
| 2 | −1 | −1 | −1 | −1 | −1 |
| 3 | −1 | −1 | −1 | −1 | −1 |
| 4 | −2* | −2 | −2 | −2 | −2 |
| 5 | −2 | −2 | −2 | −2 | −2 |
| 6 | −2 | −2 | −2 | −2 | −2 |
| 7 | −2 | −2 | −2 | −2 | −2 |
| 8 | −2 | −2 | −2 | −2 | −2 |

TABLE 2-continued

| | circumscribed | | | | |
|---|---|---|---|---|---|
| | 0 | 0.2 | 0.4 | 0.6 | 0.8 |
| 9 | −2 | −2 | −2 | −2 | −2 |
| 10 | −2 | −2 | −3* | −3 | −3 |
| 11 | −2* | −2 | −2 | −2 | −2 |
| 12 | −2 | −2 | −2 | −2 | −2 |
| 13 | −2 | −2 | −2 | −2 | −2 |
| 14 | −2 | −2 | −2 | −2 | −2 |
| 15 | −2 | −2 | −2 | −2 | −2 |
| 16 | −2 | −2 | −2 | −2 | −1* |
| 17 | −1 | −1 | −1 | −1 | −1 |
| 18 | −1 | −1 | −1 | −1 | −1 |
| 19 | −1 | 0* | 0 | 0 | 0 |
| 20 | 0 | 0 | 0 | 0 | 0 |
| 21 | 0 | 1* | 1 | 1 | 1 |
| 22 | 1 | 1 | 1 | 1 | 1 |
| 23 | 1 | 1 | 1 | 1 | 1 |
| 24 | 2* | 2 | 2 | 2 | 2 |
| 25 | 2 | 2 | 2 | 2 | 2 |
| 26 | 2 | 2 | 2 | 2 | 2 |
| 27 | 2 | 2 | 2 | 2 | 2 |
| 28 | 2 | 2 | 2 | 2 | 2 |
| 29 | 2 | 2 | 2 | 2 | 2 |
| 30 | 2 | 2 | 3* | 3 | 3 |
| 31 | 2* | 2 | 2 | 2 | 2 |
| 32 | 2 | 2 | 2 | 2 | 2 |
| 33 | 2 | 2 | 2 | 2 | 2 |
| 34 | 2 | 2 | 2 | 2 | 2 |
| 35 | 2 | 2 | 2 | 2 | 2 |
| 36 | 2 | 2 | 2 | 2 | 1* |
| 37 | 1 | 1 | 1 | 1 | 1 |
| 38 | 1 | 1 | 1 | 1 | 1 |
| 39 | 1 | 0* | 0 | 0 | 0 |

The asterisked boxes are the boxes for which there is an increase or a decrease in the time shift expressed in number of clock pulses.

A table 3 represents table 2 as a function of the clock pulse rank. As input the service time is replaced with the rank of the service clock transition; this may be said to be the service time expressed in number of pulses. For example, the service time 1.2 μs is replaced with the result of dividing it by 0.2 μs, i.e. 6. The first column of table 3 represents the tens (0 in this instance) and the first row represents the units (6 in this instance). Therefore, the input is the rank of the modulated clock pulse and the output the difference (actual time−service time), expressed in shift of clock pulses.

To generate an event, having a method of continuous compensation transforming the service time into actual time will make it possible to obtain optimized generation.

TABLE 3

| | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | −1* | −1 | −1 | −1 |
| 1 | −1 | −1 | −1 | −1 | −1 | −1 | −1 | −1 | −1 | −1 |
| 2 | −2* | −1 | −1 | −1 | −1 | −2 | −2 | −2 | −2 | −2 |
| 3 | −2 | −2 | −2 | −2 | −2 | −2 | −2 | −2 | −2 | −2 |
| 4 | −2 | −2 | −2 | −2 | −2 | −2 | −2 | −2 | −2 | −2 |
| 5 | −2 | −2 | −3* | −3 | −3 | −2* | −2 | −2 | −2 | −2 |
| 6 | −2 | −2 | −2 | −2 | −2 | −2 | −2 | −2 | −2 | −2 |
| 7 | −2 | −2 | −2 | −2 | −2 | −2 | −2 | −2 | −2 | −2 |
| 8 | −2 | −2 | −2 | −2 | −1* | −1 | −1 | −1 | −1 | −1 |
| 9 | −1 | −1 | −1 | −1 | −1 | −1 | 0 | 0 | 0 | 0 |
| 10 | 0 | 0 | 0 | 0 | 0 | 0 | 1 | 1 | 1 | 1 |
| 11 | 1 | 1 | 1 | 1 | 1 | 1 | 1 | 1 | 1 | 1 |
| 12 | 2* | 2 | 2 | 2 | 2 | 2 | 2 | 2 | 2 | 2 |
| 13 | 2 | 2 | 2 | 2 | 2 | 2 | 2 | 2 | 2 | 2 |
| 14 | 2 | 2 | 2 | 2 | 2 | 2 | 2 | 2 | 2 | 2 |
| 15 | 2 | 2 | 3* | 3 | 3 | 2* | 2 | 2 | 2 | 2 |
| 16 | 2 | 2 | 2 | 2 | 2 | 2 | 2 | 2 | 2 | 2 |
| 17 | 2 | 2 | 2 | 2 | 2 | 2 | 2 | 2 | 2 | 2 |
| 18 | 2 | 2 | 2 | 2 | 1* | 1 | 1 | 1 | 1 | 1 |
| 19 | 1 | 1 | 1 | 1 | 1 | 1 | 0* | 0 | 0 | 0 |

Table 4 applies the correction shown in table 3 to the rank of pulses. This allows estimation of the actual time as a function of the service time. That is to say that if the time service value, expressed in number of pulses, is added to this difference (actual time−service time), the value of the actual time is retrieved, expressed in number of pulses.

For this table 4, by taking as example the 151th pulse of the modulated clock which is represented in row 15 and in column 1, the latter being the second of the columns which go from 0 to 9 in intervals of 1, the compensated result indicates 153 pulses instead of 151 of a regular clock period of 0.2 μs, thus giving:

$$153 \times 0.2 = 30.6 \text{ μs}$$

while the service time is:

$$151 \times 0.2 = 30.2 \text{ μs}$$

As verification, table 1 previously indicated that for 30.2 μs of measured service time, the actual time is 30.697 μs. The difference between tables 1 and 4 is therefore 30.697−30.6=0.097 μs which is smaller than half a clock period, this half being 0.1 μs.

A real-time circuit implementing table 4 would prevent the $6^{th}$, $20^{th}$, $52^{nd}$, $155^{th}$, $184^{th}$ and $196^{th}$ clock pulses from increasing the counting at the following pulse while the $55^{th}$, $84^{th}$, $96^{th}$, $106^{th}$, $120^{th}$ and $152^{nd}$ clock pulses increase by 2 with respect to the preceding pulse.

TABLE 4

| | 0 | 1 | 2 | 3 | 4 | 5 | 6 | 7 | 8 | 9 |
|---|---|---|---|---|---|---|---|---|---|---|
| 0 | | 1 | 2 | 3 | 4 | 5 | 5* | 6 | 7 | 8 |
| 1 | 9 | 10 | 11 | 12 | 13 | 14 | 15 | 16 | 17 | 18 |
| 2 | 18* | 19 | 20 | 21 | 22 | 23 | 24 | 25 | 26 | 27 |
| 3 | 28 | 29 | 30 | 31 | 32 | 33 | 34 | 35 | 36 | 37 |
| 4 | 38 | 39 | 40 | 41 | 42 | 43 | 44 | 45 | 46 | 47 |
| 5 | 48 | 49 | 49* | 50 | 51 | 53* | 54 | 55 | 56 | 57 |
| 6 | 58 | 59 | 60 | 61 | 62 | 63 | 64 | 65 | 66 | 67 |
| 7 | 68 | 69 | 70 | 71 | 72 | 73 | 74 | 75 | 76 | 77 |
| 8 | 78 | 79 | 80 | 81 | 83* | 84 | 85 | 86 | 87 | 88 |
| 9 | 89 | 90 | 91 | 92 | 93 | 94 | 96* | 97 | 98 | 99 |
| 10 | 100 | 101 | 102 | 103 | 104 | 105 | 107* | 108 | 109 | 110 |
| 11 | 111 | 112 | 113 | 114 | 115 | 116 | 117 | 118 | 119 | 120 |
| 12 | 122* | 123 | 124 | 125 | 126 | 127 | 128 | 129 | 130 | 131 |
| 13 | 132 | 133 | 134 | 135 | 136 | 137 | 138 | 139 | 140 | 141 |
| 14 | 142 | 143 | 144 | 145 | 146 | 147 | 148 | 149 | 150 | 151 |
| 15 | 152 | 153 | 155* | 156 | 157 | 157* | 158 | 159 | 160 | 161 |
| 16 | 162 | 163 | 164 | 165 | 166 | 167 | 168 | 169 | 170 | 171 |
| 17 | 172 | 173 | 174 | 175 | 176 | 177 | 178 | 179 | 180 | 181 |
| 18 | 182 | 183 | 184 | 185 | 185* | 186 | 187 | 188 | 189 | 190 |
| 19 | 191 | 192 | 193 | 194 | 195 | 196 | 196* | 197 | 198 | 199 |

Figure 7A:
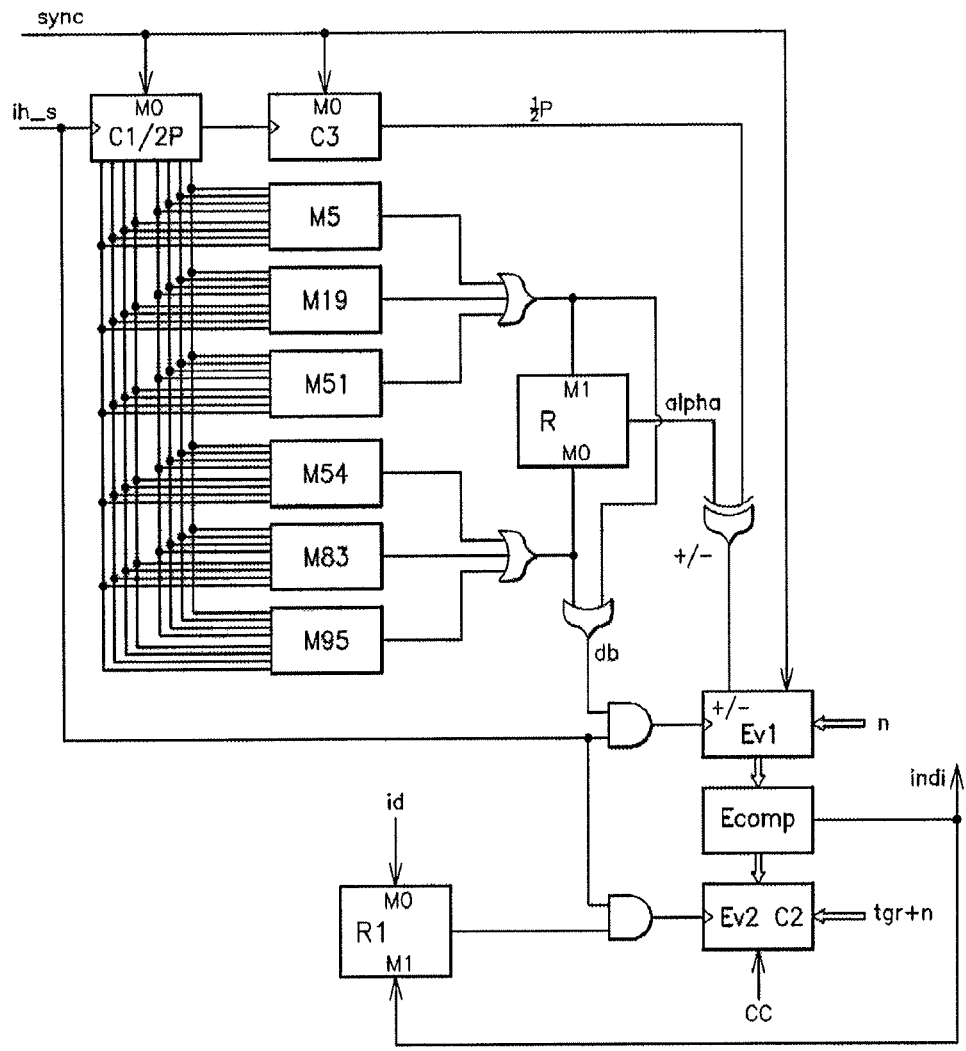
FIGS. 7a, 7b and 8a, 8b illustrate a layout of the compensation circuit for the implementation of the method of compensation according to an aspect of the present invention, this circuit being shown in FIG. 7a in its embodiment for an exemplary periodic and symmetric algorithm and in FIG. 7b for the same exemplary periodic algorithm without recourse to symmetry, this circuit being shown in FIG. 8a in its embodiment for a periodic and symmetric algorithm and in FIG. 8b in its embodiment for a periodic, symmetric or non-symmetric algorithm.
Figure 7B:
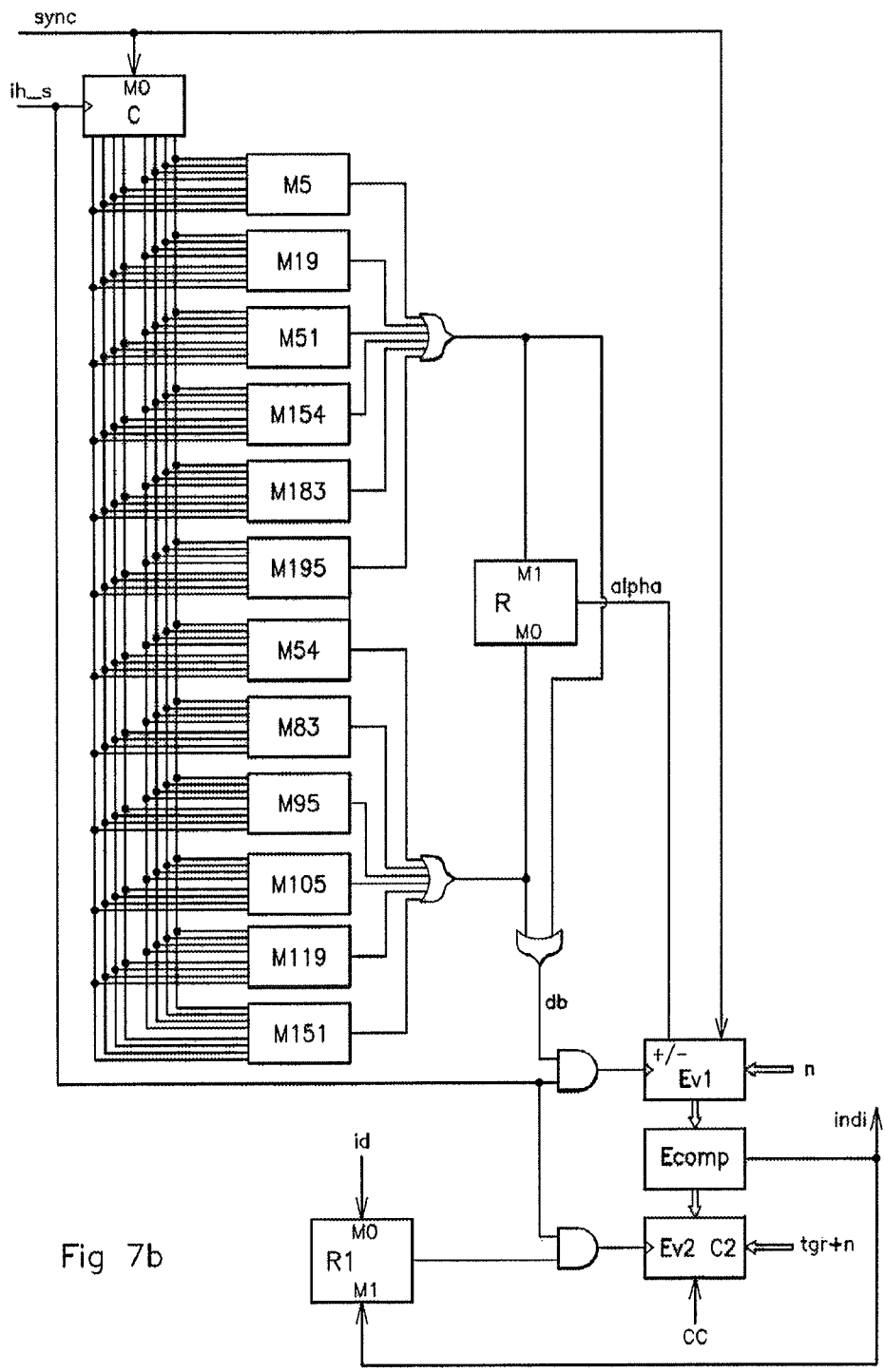
Figure 8A:
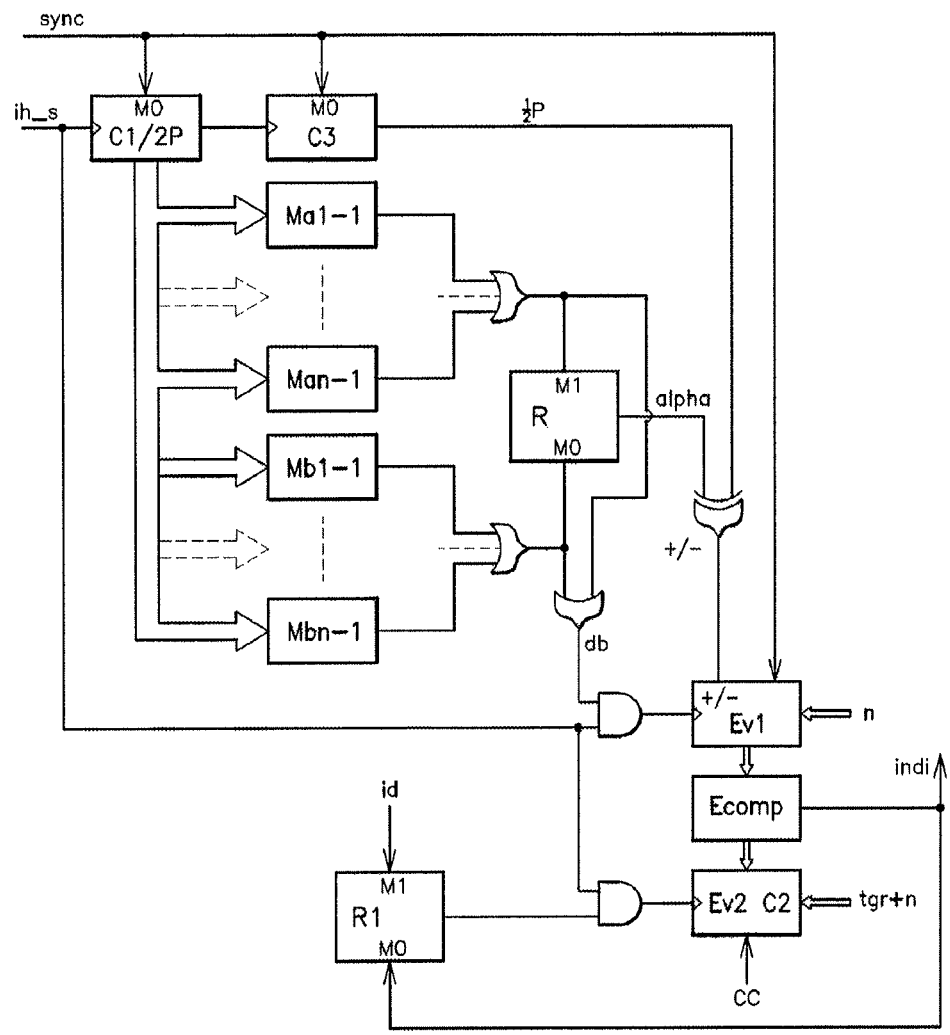
Figure 8B:
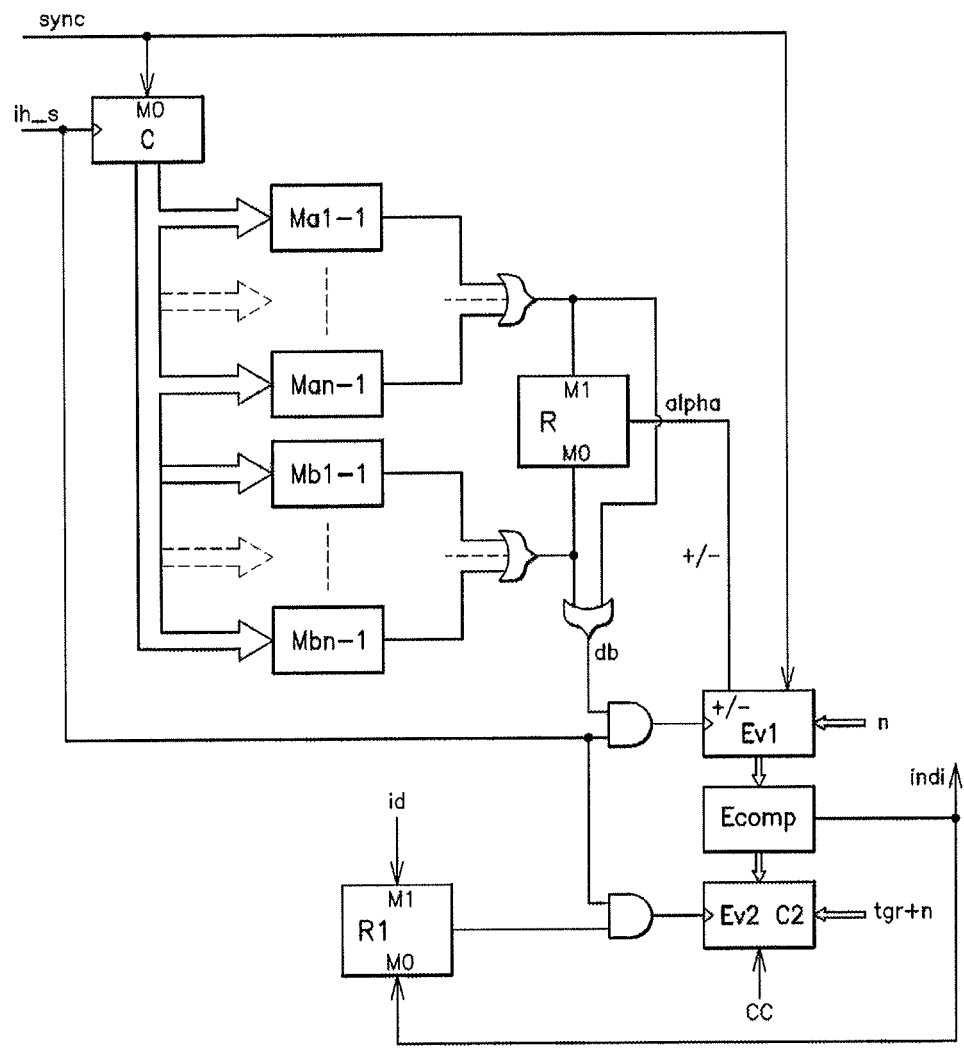

FIGS. 7a and 7b show particular cases of a compensation circuit in accordance with an aspect of the present invention while FIGS. 8a and 8b show respectively an embodiment of a general compensation circuit in accordance with an aspect of the present invention. FIGS. 7a and 8a show a circuit relating to a periodic and symmetric modulation algorithm, the symmetry being used therein to work over only a half-period or ½ P for the comparison of the pulse ranks.

Referring especially to FIGS. 8a and 8b, the steps of the method for compensating the shift between service durations and actual durations of time measurement according to an aspect of the invention are done subsequent to the method for determining a service duration on a clock signal in an electronic circuit as previously described.

The sought-after compensation is done as a function of the actual tgr and service tgs generation durations according to preceding clock pulses. A chart is firstly established giving the differences rounded to an integer number for a clock modulation as a function of a rank in a succession of pulses, this corresponding to table 4.

Thereafter is undertaken the determination of the pulse ranks on the basis of which a shift, respectively positive or negative, in the counting of the clock pulses is observed with respect to the directly preceding rank. This leads to the formation of a first group of numbers [a1:an] of pulse rank associated with a decrease in the counting of the clock pulses, and of a second group of numbers [b1:bn] of pulse rank associated with an increase in the counting of the clock pulses.

There is then undertaken the allocating of a rank for a pulse at a given instant in a succession of pulses of a clock signal. This rank is then compared with the rank numbers [a1-1:an-1], [b1-1:bn-1] of the first and second groups. This serves to determine which group appertains to a pulse to which a rank has been allocated. Any pulse may belong to the first or to the second group or to neither of the two groups. It is the values (ax-1) and (bx-1) which are taken because the comparison can only have any action at the following clock pulse.

Within the framework of an aspect of the invention, it may be possible to provide for other additional groups, for example groups with a pulse jump of + or −2.

To carry out this jump by deduction or by increase in the counting of pulses, at each pulse the dynamic bias Ev1 is updated, this corresponding to the difference between actual duration tgr and service duration tgs. If the pulse is of rank (ax-1), a deduction is undertaken, if it is of rank (bx-1), an increase is undertaken, and in the other cases, the value remains unchanged. This makes it possible to obtain a first error value.

In parallel with these steps, there is undertaken the counting of the service duration tgs with determination of a corresponding actual duration tgr and of a second error between actual duration tgr and service duration tgs thus counted.

Thereafter is undertaken the comparison of the first and second errors with the emission of an event indicator indi as soon as a comparison gives equality between first and second errors.

The compensation circuit for the implementation of such a method of compensation comprises a counter of pulses C in a clock signal ih_s circuit, the counter of pulses C or C½P allocating a rank to each effective pulse of a succession of pulses. This counter may be in the case of a variation algorithm for spectrum spreading a half-period counter referenced C½P in FIGS. 7a and 8a.

The circuit also comprises comparison modules [Ma1-1: Man-1]; [Mb1-1:Mbn-1] with comparison of the rank allocated to each effective pulse with each of the ranks of the succession of pulses of the first and second groups [a1-1: an-1]; [b1-1:bn-1]. A module [Ma1-1:Man-1]; [Mb1-1:Mbn-1] is advantageously present for each rank of the first and second groups [a1-1:an-1]; [b1-1:bn-1].

The circuit comprises a direction register R determining an addition or a deduction symbolized by −/+ of a unit in a first cell Ev1 for evaluating a first error. The first cell Ev1 exhibits means of addition or deduction to or from the dynamic bias which are constituents of the first error.

The circuit comprises a second cell Ev2 for evaluating a second error which is the difference between an actual duration tgr and a service duration tgs, the service duration tgs being measured by a down-counter C2 on the basis of a start pulse id and the actual duration tgr being introduced additionally into the second cell Ev2.

Between the first and second evaluation cells Ev1 and Ev2 is situated a comparison cell Ecomp performing the comparison between the first and second respective errors of the first and second cells Ev1, Ev2. An event indicator indi is then emitted when the first and second errors are equal.

For the first and second errors, in each cell Ev1, EV2 there is added a constant heel n in the guise of a positive natural integer sufficient for the first and second errors to be always greater than 0. For example, this heel may be equal to 3 but this is not limiting.

Once the heel n has been pre-loaded into the service time counter C2 with a value to be loaded which is tgr+n, a start pulse id allows the countdown to begin. It is from this moment that there is undertaken a comparison of the first error with respect to the second error based on a service duration counted by the counter C2. When the first error is equal to the second error, the event indicator indi takes the value 1 and can trigger the desired event.

Once the event indicator indi is equal to 1, the counter C2 is disabled but as the first error may still vary by addition of increments, this may create a toggling of the event indicator indi after a significant transition which is the first after the emission of the start pulse id.

The loading of the second cell Ev2 is controlled by a loading command CC. Another register R1 commands the beginning of the countdown by being set to 1 by the start pulse id and set to 0 by the emission of an event indicator indi.

Referring to FIG. 8a, when the variation algorithm is symmetric, this not always being the case within the framework of an aspect of the present invention, it is possible due to the symmetry of the table due to the symmetric algorithm to use a half-period counting sufficient in this case to determine the significant ranks of pulses.

Referring especially to table 3 and to FIG. 7b, if the pulse rank is 5, 19, 51, 54, 83, 95, 105, 119, 151, 154, 183 or 195, the modulated clock is authorized to increment or decrement the evaluation cell Ev1 acting as counter. This will, however, be effective only at the next clock pulse so that the evaluation cell Ev1 acting as counter will change the value to the pulse rank 6, 20, 52, 55, 84, 96, 106, 120, 152, 155, 184 or 196. This is an example in respect of the selection of the values (ax-1) and (bx-1) mentioned previously.

The error reckoned in the evaluation cell Ev1 acting as counter Ev1 is a dynamic bias which consists of an aggregate of increases or decreases according to the pulse rank, as shown in table 4.

As illustrated in FIGS. 7a and 8a, the recognition of the direction of variation, increase or decrease, is done if the algorithm is symmetric as a function of the output of the counter by twos C3, in addition to the detection of the pulse rank.

For example, in FIG. 7a, the pulse ranks 5, 19, 51, 154, 183 or 195 require a decrease of 1 while the pulse ranks 154, 183 or 195 are identified as being 54, 83 or 95 with a signal corresponding to a half-period of the algorithm and referenced ½ P equal to 1.

It should indeed be considered that the counting is done preferentially over a half-period of the variation algorithm with periodic modulation and is performed by a counter by twos C3.

As other example, the pulse ranks 54, 83, 95, 105, 119 or 151 require an increase of 1 while the pulse ranks 105, 119 or 151 are identified as being 5, 19 or 51 with the signal ½ P equal to 1.

Table 5 shows the counting logic by increase or decrease of the dynamic bias on the basis of table 3.

TABLE 5

| Detection rank | Alpha | ½ P | +/− | Ev1 Direction | Effective rank |
|---|---|---|---|---|---|
| 5 | 1 | 0 | 0 | Decrease | 6 |
| 19 | 1 | 0 | 0 | Decrease | 20 |
| 51 | 1 | 0 | 0 | Decrease | 52 |
| 54 | 0 | 0 | 1 | Increase | 55 |
| 83 | 0 | 0 | 1 | Increase | 84 |
| 95 | 0 | 0 | 1 | Increase | 96 |
| 105 | 1 | 1 | 1 | Increase | 106 |
| 119 | 1 | 1 | 1 | Increase | 120 |
| 151 | 1 | 1 | 1 | Increase | 152 |
| 154 | 0 | 1 | 0 | Decrease | 155 |
| 183 | 0 | 1 | 0 | Decrease | 184 |
| 195 | 0 | 1 | 0 | Decrease | 196 |

Alpha indicates the direction, increasing or decreasing, of the dynamic bias for the ranks below a hundred, that is to say inside the first half-period. The inversion between increase and decrease for the second half-period is triggered by the signal ½ P, when it exists. The signal +/− takes into account Alpha and ½P to fix the direction of counting, counting up or counting down, in the counter Ev1, and therefore carry out the increase or the deduction mentioned previously.

The locking and the permission for the updating of the dynamic bias occur with a shift of a clock pulse, whether the logic is synchronous or asynchronous, owing to the transmission times. There is therefore a shift of 1 between the detection rank and the effective rank.

For clock pulse ranks 6, 20, 52, 155, 184 or 196, the value 1 is deducted from the dynamic bias.

For clock pulse ranks 55, 84, 96, 106, 120, 152, the value 1 is added to the dynamic bias.

TABLE 6

| Pulse rank | Ev1 Error |
|---|---|
| ≤5 | 3 |
| 6 to 19 | 2 |
| 20 to 51 | 1 |
| 52 to 54 | 0 |
| 55 to 83 | 1 |
| 84 to 95 | 2 |
| 96 to 104 | 3 |
| 106 to 119 | 4 |
| 120 to 151 | 5 |
| 152 to 154 | 6 |
| 155 to 183 | 5 |
| 184 to 195 | 4 |
| ≥196 | 3 |

In order not to have to work on negative values, it is appropriate to load the dynamic bias with a positive heel, for example of 3, doing so at each synchronization. Therefore, the counter of actual time has also to be increased by 3 when pre-loaded.

Table 6 indicates the error reckoned by the evaluation cell Ev1 acting as error counter as a function of the rank of pulses, on the basis of the example of table 1.

Let us assume that one wishes, for example, to generate on the basis of table 1 an event 5 µs after the synchronization instant which corresponds to a maximum modulated frequency. Table 1 shows that it is necessary to consider 5.4 µs in order to obtain 5.023 µs of actual duration.

TABLE 7

| Clock pulse rank | Ev1 | Ev2 | indi |
|---|---|---|---|
| 1 | 3 | 27 | 0 |
| 2 | 3 | 26 | 0 |
| 3 | 3 | 25 | 0 |
| 4 | 3 | 24 | 0 |
| 5 | 3 | 23 | 0 |
| 6 | 2 | 22 | 0 |
| 7 | 2 | 21 | 0 |
| 8 | 2 | 20 | 0 |
| 9 | 2 | 19 | 0 |
| 10 | 2 | 18 | 0 |
| 11 | 2 | 17 | 0 |
| 12 | 2 | 16 | 0 |
| 13 | 2 | 15 | 0 |
| 14 | 2 | 14 | 0 |
| 15 | 2 | 13 | 0 |
| 16 | 2 | 12 | 0 |
| 17 | 2 | 11 | 0 |
| 18 | 2 | 10 | 0 |
| 19 | 2 | 9 | 0 |
| 20 | 1 | 8 | 0 |
| 21 | 1 | 7 | 0 |
| 22 | 1 | 6 | 0 |
| 23 | 1 | 5 | 0 |
| 24 | 1 | 4 | 0 |
| 25 | 1 | 3 | 0 |
| 26 | 1 | 2 | 0 |
| 27 | 1 | 1 | 1 |

The application of the method of compensation according to an aspect of the present invention culminates in pre-loading the value 3 into the first evaluation cell Ev1 acting as up-counter and 28 into the second evaluation cell Ev2 acting as down-counter. The variation of the values until equality of the difference of the values of the counters Ev1 and Ev2 is given by the following table which is table 7.

In this table, the pulse of rank 27 corresponds to 5.4 us in the frame of reference of the service time, therefore 5.023 us in actual time in accordance with table 1. It does indeed trigger the rise to 1 of the indicator indi at 5.023 us after the start pulse, for 5 us targeted.

The invention claimed is:

1. A method for counting a service duration (tms) of time measurement on a clock signal comprising periodic clock transitions in an electronic circuit and for determining an actual duration (tmr) of time measurement as a function of the service duration, the clock signal having undergone spectrum spreading according to a periodic variation algorithm causing a frequency modulation of the clock transitions of said signal and creating a difference between actual duration and service duration, the method comprising:
   there is undertaken the counting, during successive time increments, at least a service time for starting (t_d_s) and a service time for stopping (t_a_s); and
   on the basis of these service times for starting and for stopping, determining the actual times for starting and for stopping (t_d, t_a) serving for the calculation of the actual duration of measurement as a function of the parameters of the variation algorithm,
   wherein the difference between the actual duration of measurement and the service duration is established as a function of the actual times for starting and for stopping and of the service times for starting and for stopping according to the following formula:

$$tmr-tms=(t\_a-t\_a\_s)-(t\_d-t\_d\_s).$$

2. The method as claimed in claim 1, in which there is compiled a table giving the actual duration as a function of the service duration and a chart giving the differences rounded to a multiple of a clock period for a clock modulation as a function of a rank in a succession of pulses.

3. The method as claimed in claim 1, in which, the variation algorithm being periodically oscillating between maximum and minimum frequencies, the parameters of the variation algorithm are at least the period of the algorithm and a point of application of the algorithm referring to the maximum or minimum frequencies or to a median point between maximum and minimum frequencies.

4. A method for counting a service duration (tms) of time measurement on a clock signal comprising periodic clock transitions in an electronic circuit and for determining an actual duration (tmr) of time measurement as a function of the service duration, the clock signal having undergone spectrum spreading according to a periodic variation algorithm causing a frequency modulation of the clock transitions of said signal and creating a difference between actual duration and service duration, the method comprising:

there is undertaken the counting, during successive time increments, at least a service time for starting (t_d_s) and a service time for stopping (t_a_s); and on the basis of these service times for starting and for stopping, determining the actual times for starting and for stopping (t_d, t_a) serving for the calculation of the actual duration of measurement as a function of the parameters of the variation algorithm, in which, the variation algorithm being periodically oscillating between maximum and minimum frequencies, the parameters of the variation algorithm are at least a period (t_p) of the algorithm and a point of application of the algorithm referring to the maximum or minimum frequencies or to a median point between maximum and minimum frequencies.

5. A method for counting a service duration (tms) of time measurement on a clock signal comprising periodic clock transitions in an electronic circuit and for determining an actual duration (tmr) of time measurement as a function of the service duration, the clock signal having undergone spectrum spreading according to a periodic variation algorithm causing a frequency modulation of the clock transitions of said signal and creating a difference between actual duration and service duration, the method comprising:

there is undertaken the counting, during successive time increments, at least a service time for starting (t_d_s) and a service time for stopping (t_a_s);

on the basis of these service times for starting and for stopping, determining the actual times for starting and for stopping (t_d, t_a) serving for the calculation of the actual duration of measurement as a function of the parameters of the variation algorithm;

counting the service times for starting and for stopping as well as the service duration;

emitting an arming pulse to mark the initialization of the method; and emitting a synchronization pulse periodically in correspondence with the period of the clock signal and of the variation algorithm, with, for each respective counting of the service times and duration, an emission of a start pulse initiating the beginning of the counting of the service time for stopping and of the service duration and initiating the end of the counting of the service time for starting, the service time for starting being counted between the last synchronization pulse preceding the start pulse and this start pulse, the service duration being counted between the start pulse and a pulse for stopping, the pulse for stopping also terminating the counting of the service time for stopping (t_a_s) beginning with the last synchronization pulse preceding the stopping pulse (ia).

6. A counting circuit for the implementation of the method for determining a service duration with respect to a clock signal as claimed in claim 5, comprising:

three time counters associated respectively with the counting of the service time for starting of the measurement, of the service time for stopping of the measurement and of the service duration for the measurement and means for emitting arming pulses, clock pulses, synchronization pulses, pulses for starting and pulses for stopping, with:

a first bistable trigger emitting a start signal toward the first counter measuring a service time for starting with setting to 1 the start signal by an arming pulse and setting to 0 the signal by a start pulse, the counting of the time by the first counter being done as a function of a clock signal when the start signal is set to 1, means of transmission to the first counter of synchronization pulses resetting the first counter to 0, a second bistable trigger emitting a so-called start-stop duration signal toward a second counter measuring a service duration, with setting to 1 of the signal by a start pulse and setting to 0 of the signal by a pulse for stopping, the counting of the time by the second counter being done as a function of the clock signal when the signal for stopping is set to 1, a third bistable trigger emitting a stopping signal (sa) toward a third counter measuring a service time for stopping with a setting to 1 of the signal by an arming pulse and a setting to 0 of the signal by a stopping pulse, the counting of the time by the third counter being done as a function of the clock signal when the stopping signal is set to 1, means of transmission to the third counter of synchronization pulses resetting the third counter to zero, and respective means of transmission to the three counters of an arming pulse resetting these counters to zero.

* * * * *